United States Patent [19]
Sung

[11] Patent Number: 6,146,990
[45] Date of Patent: Nov. 14, 2000

[54] METHOD OF FORMING CONTACT PLUG

[75] Inventor: Shu-Jeng Sung, I-Lan, Taiwan

[73] Assignee: United Microelectronics Corp., Hsinchu, Taiwan

[21] Appl. No.: 09/152,457

[22] Filed: Sep. 14, 1998

[30] Foreign Application Priority Data

May 22, 1998 [TW] Taiwan ................................. 87107994

[51] Int. Cl.[7] .............................................. H01L 21/4763
[52] U.S. Cl. ........................ 438/622; 438/624; 438/782; 437/187
[58] Field of Search .................................. 438/622, 624, 438/782; 437/187

[56] References Cited

U.S. PATENT DOCUMENTS

5,702,980 12/1997 Yu et al. ................................. 437/187
5,792,702 8/1998 Liang ...................................... 438/624
6,001,745 12/1999 Tu et al. ................................. 438/782

*Primary Examiner*—Richard Elms
*Assistant Examiner*—Pho Luu
*Attorney, Agent, or Firm*—Thomas, Kayden, Horstemeyer & Risley

[57] ABSTRACT

A method for preventing a contact plug on a semiconductor substrate from being poisoned. A part of the metal layer with a large and flat surface region is removed to result in a plurality of metal layers with smaller surface areas on the substrate. A first dielectric layer is formed on the metal layers. A spin-on-glass layer is formed on the first dielectric layer. The spin-on-glass layer is etched back until the first dielectric layer is exposed. A second dielectric layer is formed on the spin-on-glass layer. At lease an opening is formed to penetrate through the second dielectric layer, the spin-on-glass layer and the first dielectric layer. The opening is filled with a contact plug.

8 Claims, 13 Drawing Sheets

METHOD OF FORMING CONTACT PLUG

CROSS-REFERENCE TO RELATED APPLICATION

This application claims the priority benefit of Taiwan application serial no. 87107994, filed May 22, 1998, the full disclosure of which is incorporated herein by reference.

BACKGROUND OF THE INVENTION

1. Field of the Invention

The invention relates in general to a method of removing a silicon-on-glass residue, and more particularly, to a method of preventing the contact window from being poisoned by the residue of silicon-on-glass.

2. Description of the Related Art

Contacts have been widely applied as the multi-level interconnects between integrated circuits or semiconductor devices. In a conventional method for forming a contact, a inter-metal dielectric layer (IMD) is formed on a first wiring layer. The inter-metal dielectric layer has an opening therewithin to expose a part of the first wiring layer. A conductive layer is formed to fill the opening as a contact plug as for the interconnection between the first wiring layer and a second wiring layer formed thereafter.

Typically, the inter-metal dielectric layer comprises layers of spin-on-glass layers. Spin-on-glass is a common planarization technique to form a relative flat layer. The process comprises dissolving dielectric material into a solvent, and using spin-coating technique to cover the material on a wafer. Since the dielectric material is circulated on the wafer with the solvent, the uneven recessed surface of the wafer are easily filled with the dielectric to obtain a planarized surface. After thermal treatment, the solvent is removed to cure the dielectric material as a spin-on-glass layer. A local planarization is thus achieved. Therefore, the technique of spin-on-glass is advantageous to gap filling for preventing the formation of a void while depositing a dielectric layer.

Figure 1A:
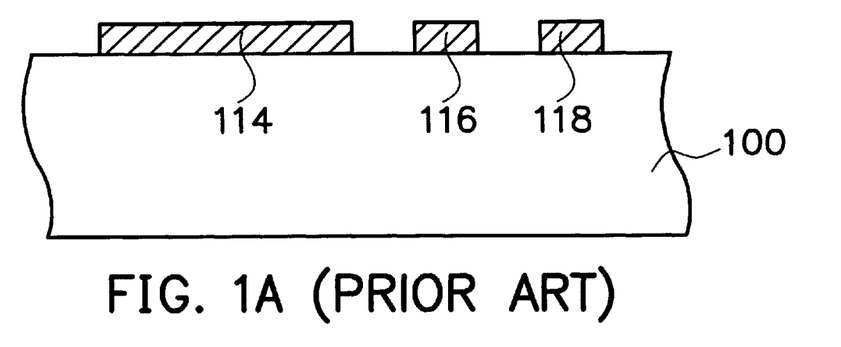
FIG. 1A to FIG. 1F are cross sectional views showing a conventional method of forming a contact plug.

The sandwich type spin-on-glass layer is widely applied in semiconductor process. FIG. 1A to FIG. 1F are cross sectional views showing a conventional method for forming the interconnect with a sandwich type spin-on-glass layer as an inter-metal dielectric layer. In FIG. 1A, a semiconductor substrate 100 comprising metal layers 114, 116, and 118 is provided. A top view of the substrate 100 is shown as FIG. 2A, and FIG. 1A is taken from the cross section of line I–I'.

Figure 1B:
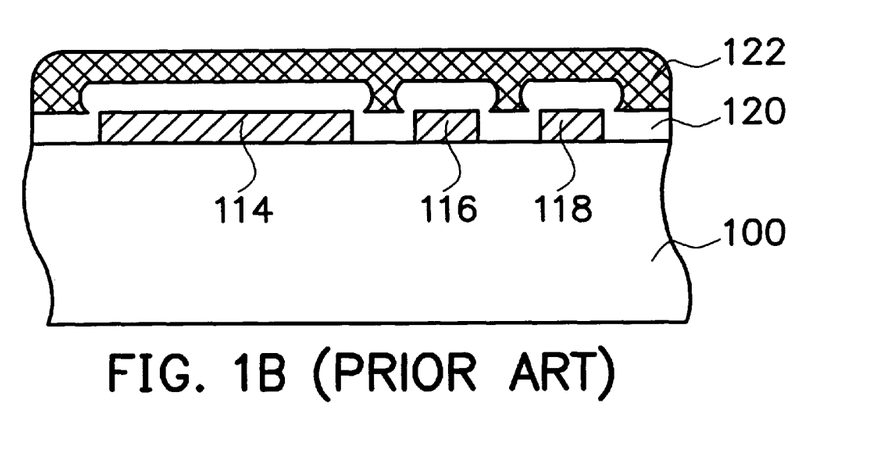
Figure 2A:
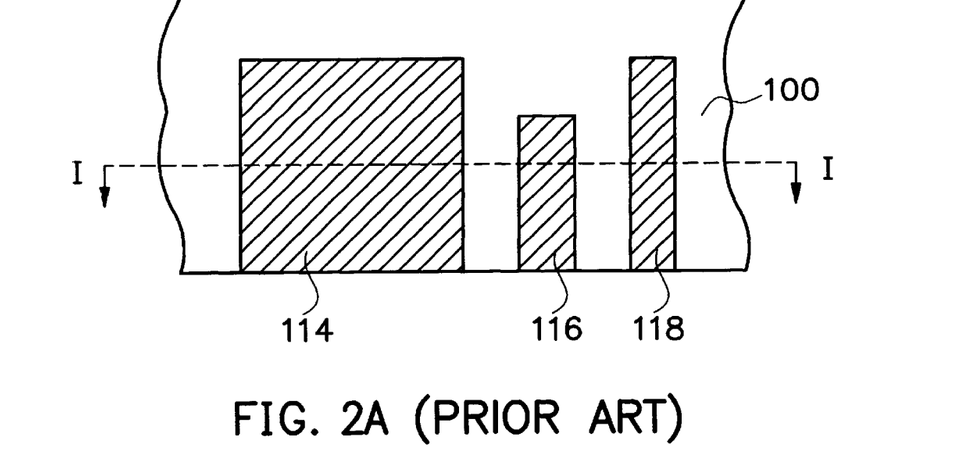
FIG. 2A is a top of the device shown in FIG. 1A.

In FIG. 1B, a dielectric layer 120 is formed to cover the whole substrate 100, including the metal layers 114, 116 and 118. A spin-on-glass layer 122 is formed on the dielectric layer 120.

Figure 1C:
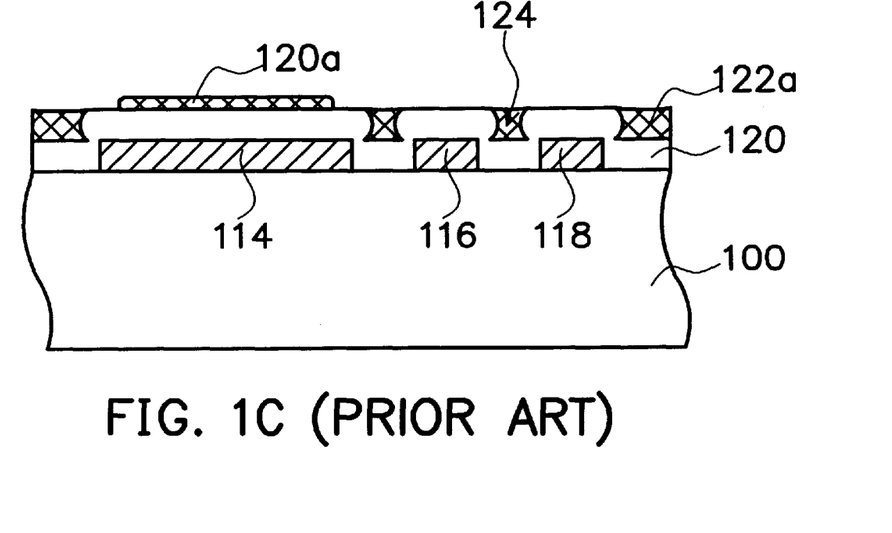

In FIG. 1C, the spin-on-glass layer 122 is etched back. Ideally, after the etch back process, the spin-on glass 122 does not only remain in and fill the recessed regions of the surface of the substrate 100 to achieve a local planarization. However, it is often to find that the spin-on-glass layer 122 does not only fill the recessed regions on the surface of the substrate 100, but the spin-on-glass layer 122 also remains on a flat surface region such as the surface of dielectric layer 122 over the metal layer 114. As shown the figure, the spin-on-glass layer remaining on the dielectric layer 122 over the metal layer 114 is denoted as 120a, whereas the spin-on-glass layer filling the recessed regions is denoted as 122a.

Figure 1D:
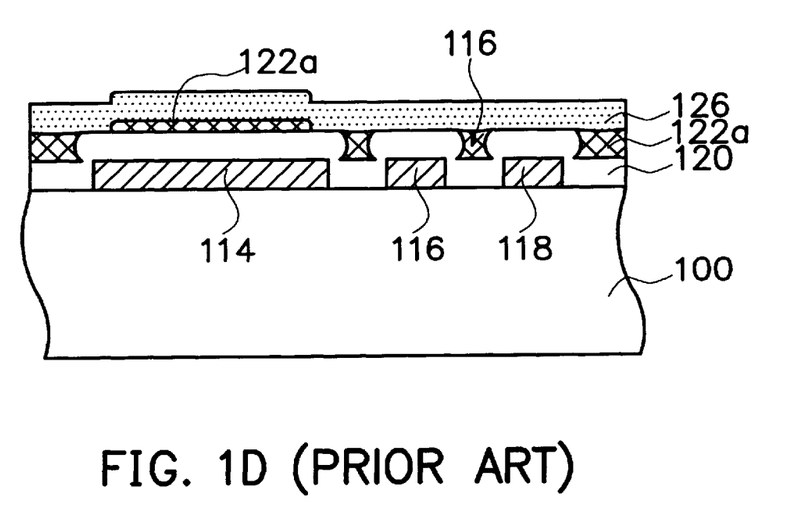

In FIG. 1D, a dielectric layer 126 is further formed to cover the dielectric layer 120 and the remaining spin-on-glass layer 120a and 122a. The dielectric layer 120, the spin-on-glass layer 122a and 120a, and the dielectric layer 126 compose a sandwich type spin-on-glass layer.

Figure 1E:
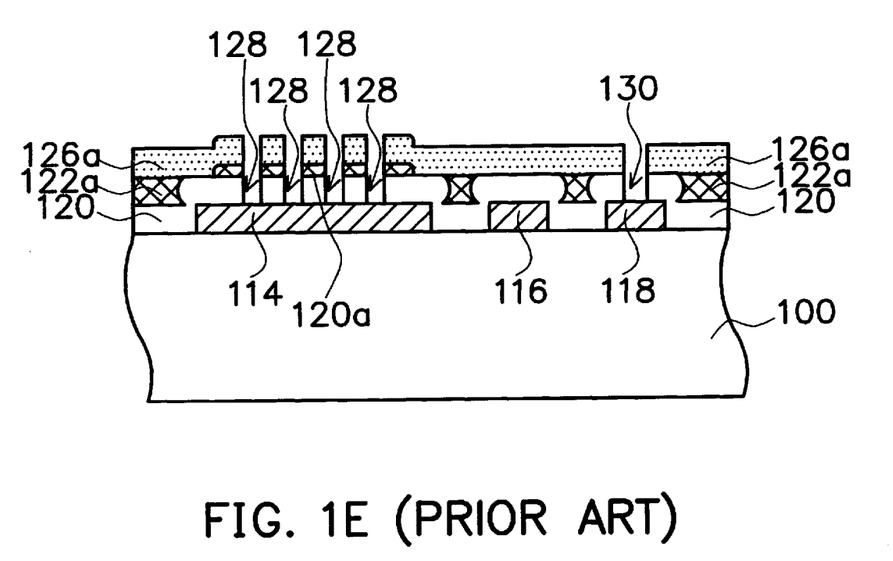
Figure 2B:
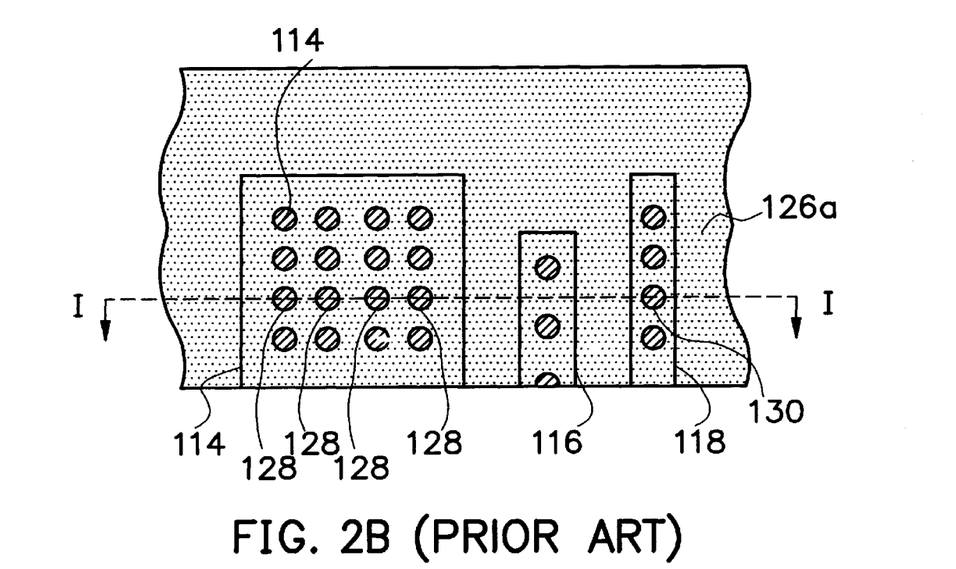
FIG. 2B is a top of the device shown in FIG. 1E.
Figure 2C:
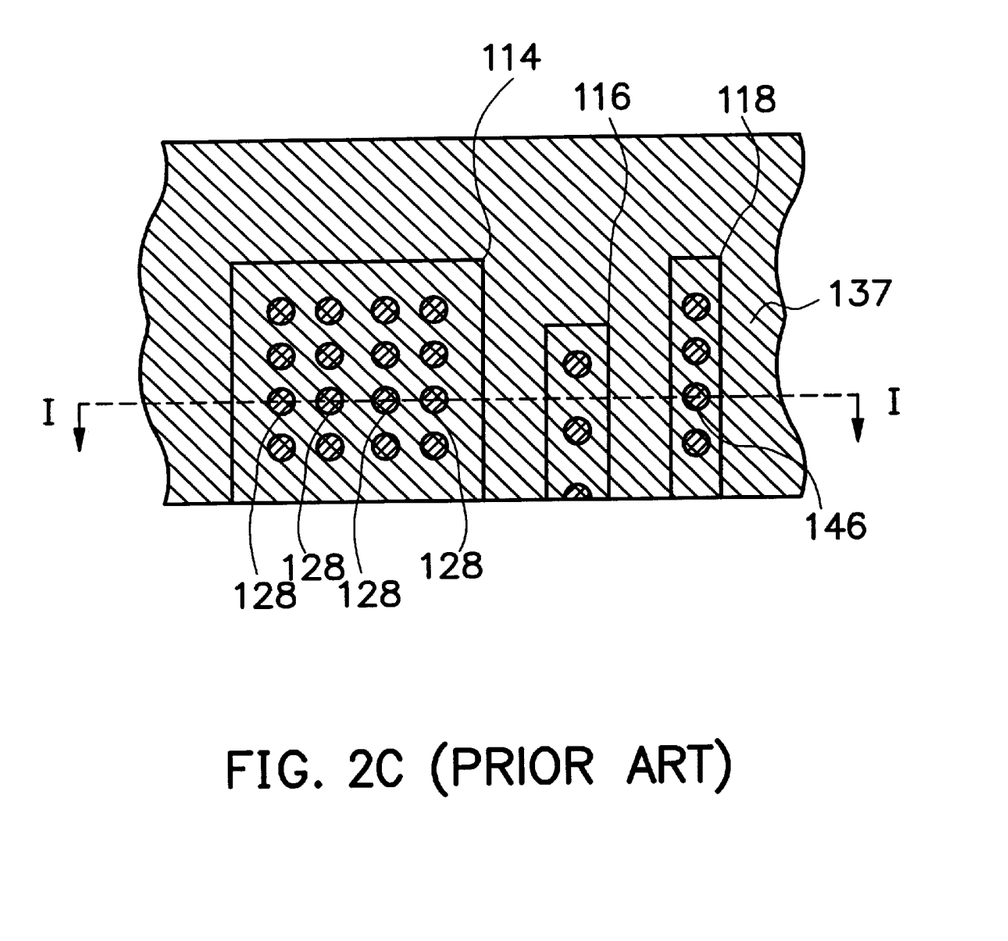
FIG. 2C is a top of the device shown in FIG. 1F.

In FIG. 1E, to achieve the interconnection between any of the metal layers 114, 116, 118 and a second wiring layer formed thereafter, the sandwich type layer is patterned to form openings 128 and 130 by photolithography and etching process. The openings 128 and 130 penetrate through the sandwich type spin-on-glass layer to expose the metal layer 114 and 118, respectively. As shown in the figure, a part of the remaining spin-on glass layer 120a is exposed on the side walls of the openings 128 which expose the metal layer 114. As mentioned above, the spin-on-glass layer 120a is formed from curing the solution containing dielectric material. Therefore, it is very often that the solvent is not removed completely during curing process. Or during the photolithography and etching process for patterning the openings 128 and 130, the remaining spin-on-glass layer 120a is very easy to absorb moisture. For either the remaining spin-on-glass layer 120a to containing solvent or moisture, the contained solvent or moisture evaporates, namely, the spin-on-glass layer 120a outgases, in a higher temperature. A top view of this figure is shown as FIG. 2B.

Figure 1F:
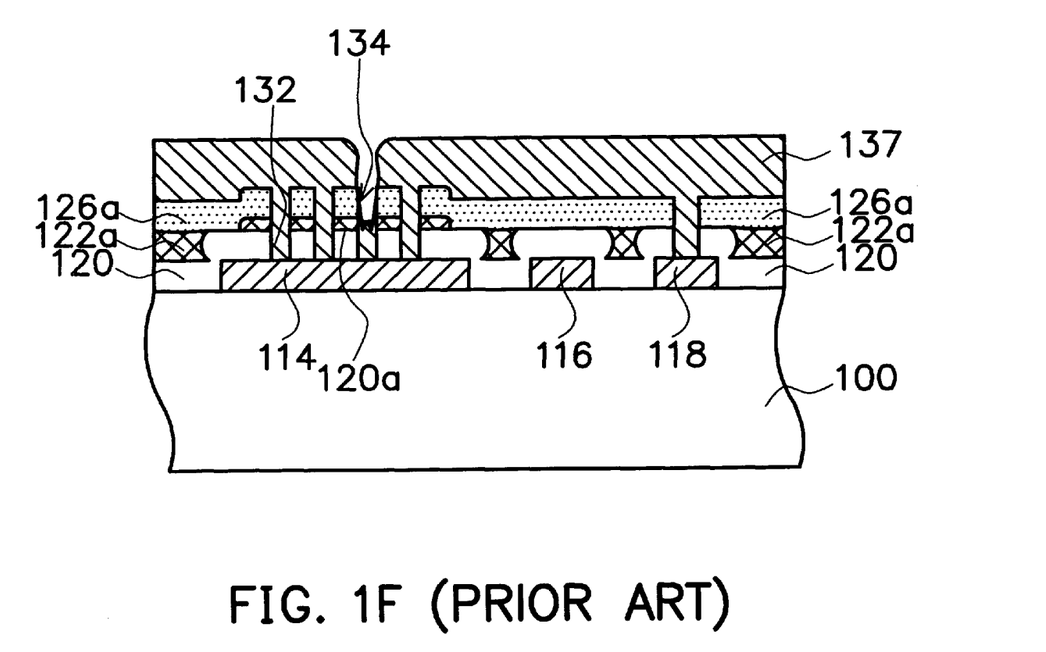

In FIG. 1F, a metal layer 137 is formed to fill the openings 128 and 130 to form contact plugs. The temperature for forming the metal layer 137 is typically so high to cause the solvent or moisture contained in the spin-on-glass layer 120a to evaporate, that is, the spin-on-glass layer 120a to outgas. The metal layer 137 is thus filled with gas void 132 evaporated from the solvent or the moisture absorbed by the spin-on-glass layer 120a. The metal layer 137 is thus poisoned. Since the metal layer 137 is formed to electrically connect the first wiring layer 126 and a second wiring layer formed thereafter, with the formation of the gas voids 132, a poor conductivity is obtained. Therefore, the quality of the device is degraded.

On the other hand, the remaining spin-on-glass layer 120a over the metal layer 114 causes the aspect ratio of forming a contact plug to increase. The higher the aspect ratio is, the poorer the step coverage is while depositing the metal layer 137. As a result, an air void 134 as shown in the figure is formed.

SUMMARY OF THE INVENTION

It is an object of the invention to provide a method of preventing the contact plug from being poisoned. During the formation of a contact plug, the spin-on-glass layer is not exposed. Therefore, the outgas phenomenon is avoided. In addition, the aspect ratio of forming the contact plug is reduced by preventing the spin-on-glass layer from remaining on any unwanted surface area.

To achieve the above-mentioned object and advantages, a method for preventing a contact plug on a semiconductor substrate from being poisoned is provided. To form a contact plug on a semiconductor substrate which comprises at least a metal layer having a flat surface region, a part of the metal layer is removed to result in a plurality of metal layers with smaller surface areas on the substrate. A first dielectric layer is formed on the metal layers. A spin-on-glass layer is formed on the first dielectric layer. The spin-on-glass layer is etched back until the first dielectric layer is exposed. A second dielectric layer is formed on the spin-on-glass layer. At lease an opening is formed to penetrate through the second dielectric layer, the spin-on-glass layer and the first dielectric layer. The opening is filled with a contact plug.

To achieve the above-mentioned object and advantages, another method for preventing a contact plug on a semiconductor substrate from being poisoned is provided. A metal layer having a flat surface region on a substrate is patterned to a mesh-like metal layers with an uneven surface on the substrate. A first dielectric layer is formed on the metal layers. A spin-on-glass layer is formed on the first dielectric layer. The spin-on-glass layer is etched back until the first dielectric layer is exposed. A second dielectric layer is formed on the spin-on-glass layer. At lease an opening is formed to penetrate through the second dielectric layer, the spin-on-glass layer and the first dielectric layer. The opening is filled with a contact plug.

Both the foregoing general description and the following detailed description are exemplary and explanatory only and are not restrictive of the invention, as claimed.

DESCRIPTION OF THE PREFERRED EMBODIMENTS

It has been mentioned that while using a sandwich type spin-on-glass layer as an inter-metal dielectric layer, a contact plug for interconnecting two metal layers is poisoned by the outgas of the exposed spin-on-glass layer. The exposed spin-on-glass layer is actually an unwanted residue remaining on a flat surface of the first metal layer. In the invention, a first metal layer with a flat surface is partitioned into a plurality of metal layers with smaller surface area. Therefore, the metal layer formed with a flat surface is replaced by a plurality of smaller metal layers with an uneven surface on the substrate. The uneven surface of the metal layer causes the spin-on-glass layer to fill the recess regions of the metal layer without remaining on the surface area.

Figure 3A:
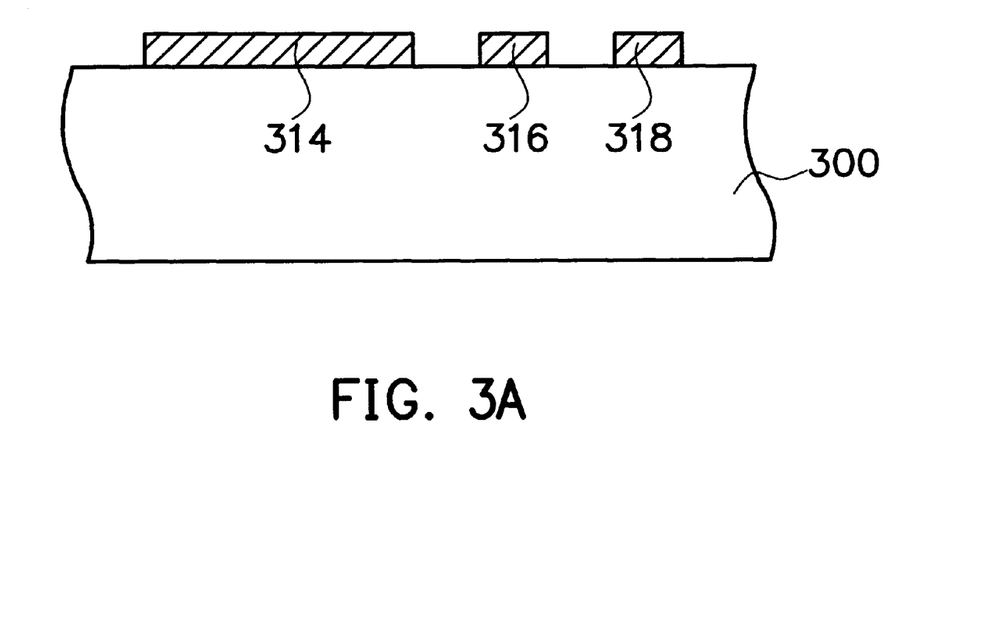
FIG. 3A to FIG. 3G are cross sectional views showing a method of forming a contact plug in a preferred embodiment according to the invention.

In FIG. 3A to FIG. 3G are cross sectional views showing a method of forming a contact plug without being poisoned according to the invention. In FIG. 3A, a substrate 300 comprising metal layers 314, 316, and 318 is provided. As shown in the figure, the metal layer 314 has a large and flat surface which typically causes the residue of a spin-on-glass layer formed subsequently. It is appreciated that a substrate with other isolation structures or active devices can also be used. A top view of this figure is shown as FIG. 4A.

Figure 3B:
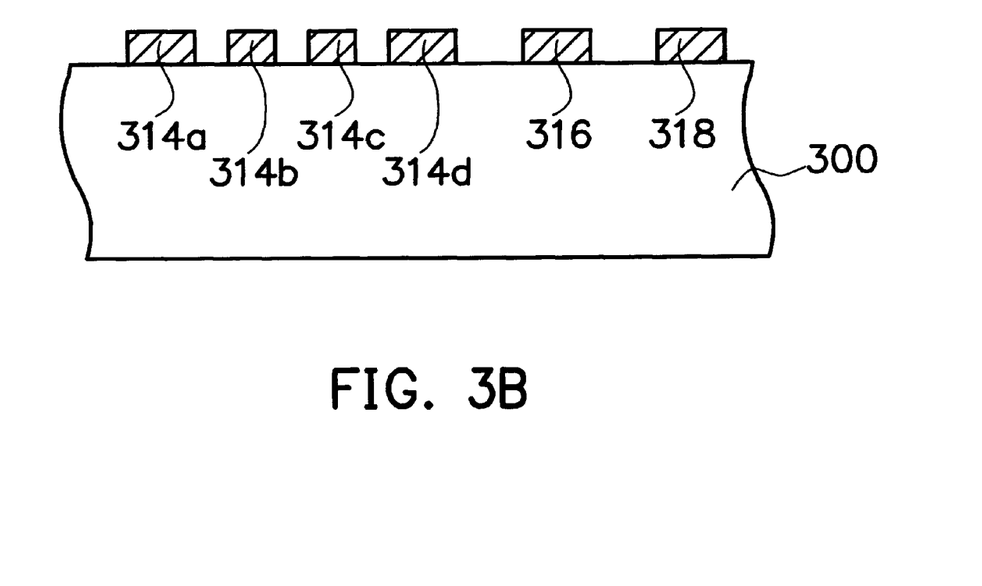
Figure 4A:
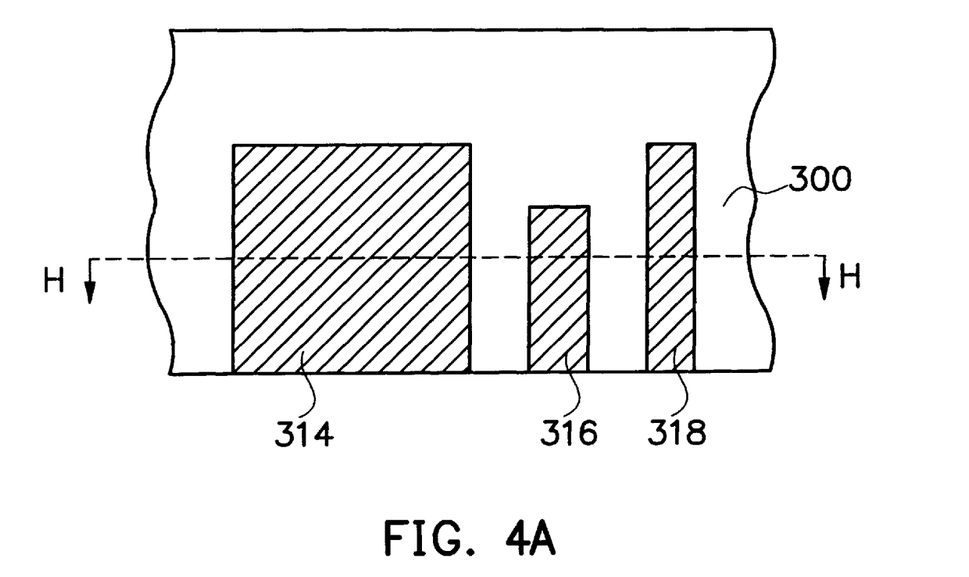
FIG. 4A is a top of the device shown in FIG. 3A.
Figure 4B:
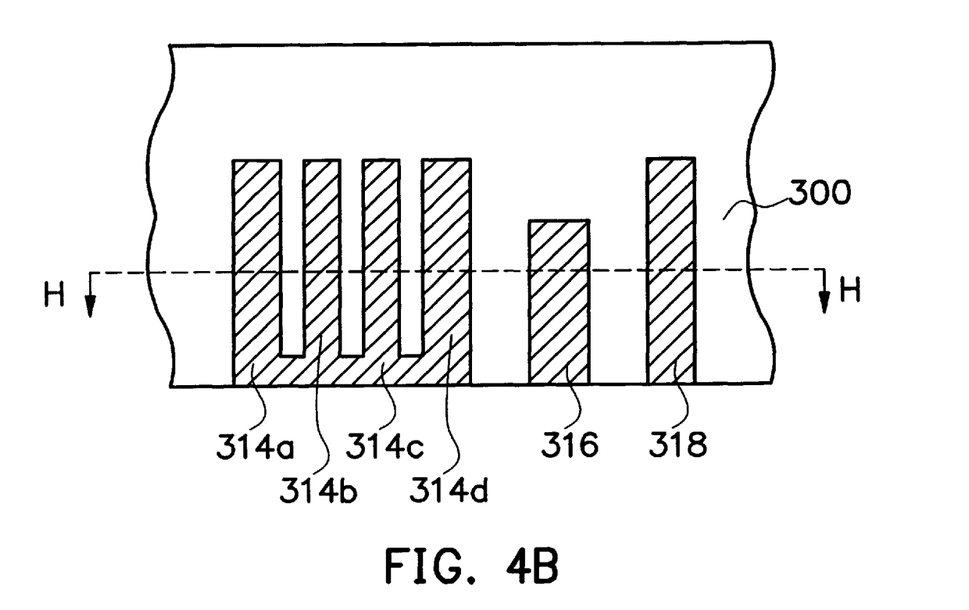
FIG. 4B is a top of the device shown in FIG. 3B.

In FIG. 3B, the metal layer 314 is partitioned into metal layers 314a, 314b, 314c and 314d with smaller surface areas. After being partitioned, a part of the substrate 100 is exposed and an uneven surface is obtained. A top view of the structure is shown in FIG. 4B. Thus, the spin-on-glass layer formed thereafter can be removed from the surface area while filling the recessed regions. The method of partitioning the metal layer 314 is preferably using a conventional photolithography and etching process.

Figure 3C:
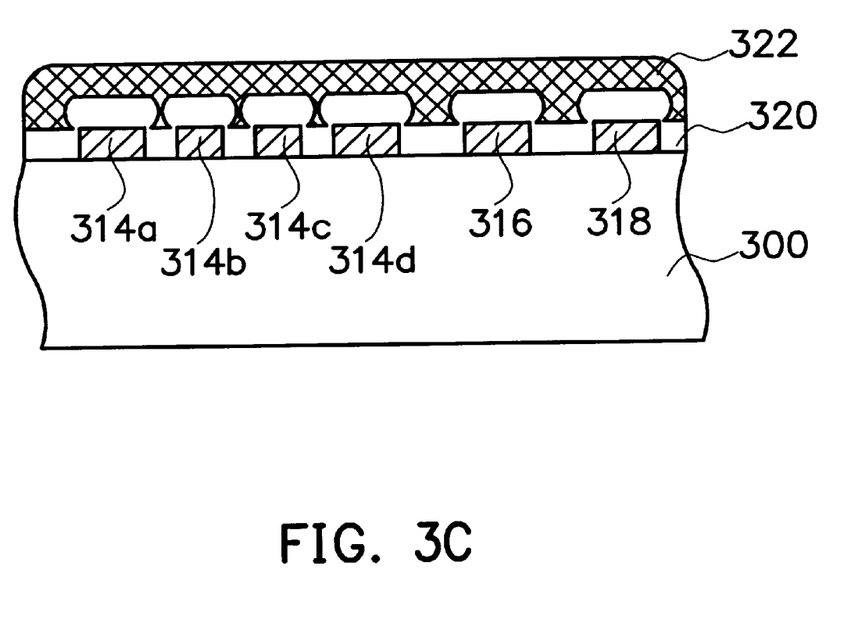

In FIG. 3C, a dielectric layer 320, for example, a silicon layer formed by plasma enhanced chemical vapor deposition (PECVD) with tetra-ethyl-ortho-silicate (TEOS) as precursor gas, is formed to cover the metal layers 314a, 314b, 314c, 314d, 316, and 318. Since an uneven surface is obtained by the formation of the metal layers 314a to 314d, the dielectric layer 320 is formed with an uneven surface. A spin-on-glass layer 322 is formed on the dielectric layer 320. The spin-on-glass 322 is then backed and cured.

Figure 3D:
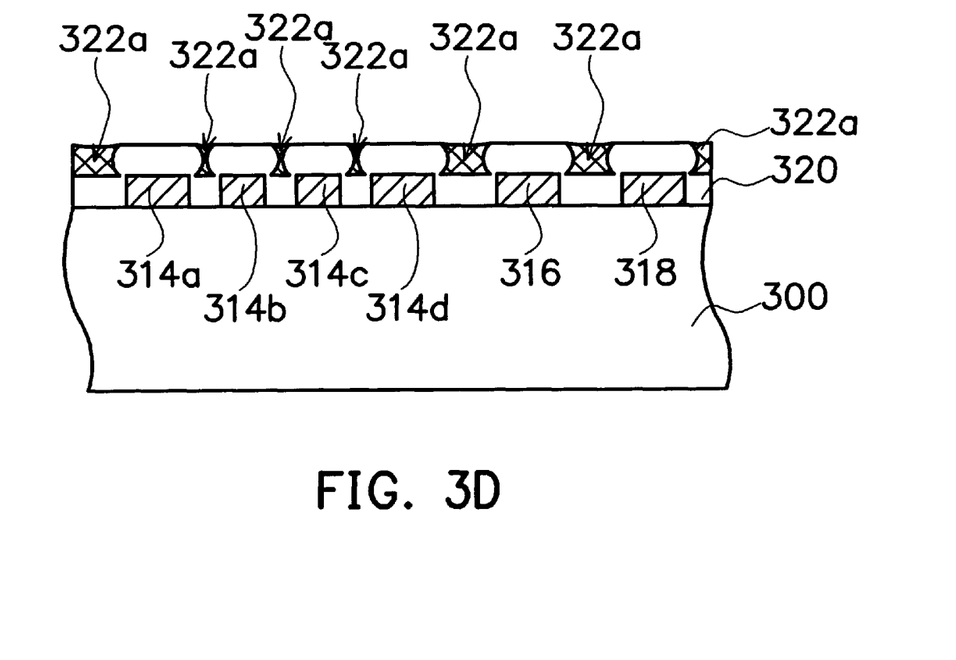

In FIG. 3D, the spin-on-glass layer 322 is etched back to obtain a local planarization. The spin-on-glass layer 332 is etched back until the dielectric layer 320 is exposed. A typical etch back process include a dry etch process with a mixture of carbon fluoride ($CF_4$), carbon tri-fluoride ($CHF_3$), and oxygen as an etching gas. As shown in the figure, since the dielectric layer 320 is formed with an uneven surface, after the etching back process, the spin-on-glass layer 322a remains on the recesses of the dielectric layer 320 only.

Figure 3E:
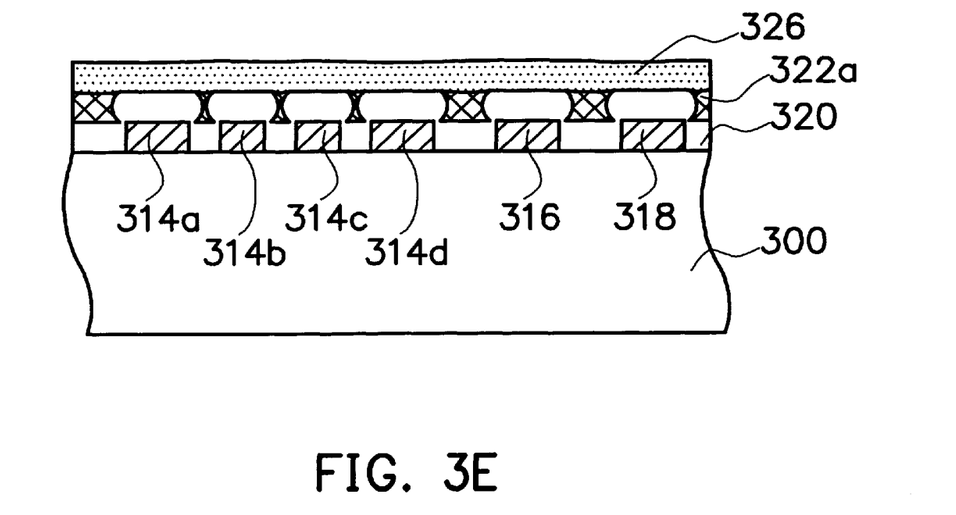

In FIG. 3E, another dielectric layer 326 is formed on the dielectric layer 320 and the spin-on-glass layer 322a. Though other material may also be adapted, preferably, the dielectric layer 326 includes a silicon oxide layer formed by plasma-enhanced chemical vapor deposition (PECVD) with tetra-ethyl-ortho-silicate (TEOS) as a precursor. The dielectric layer 320, the spin-on-glass layer 322a, and the dielectric layer 326 compose a sandwich type spin-on-glass layer.

Figure 3F:
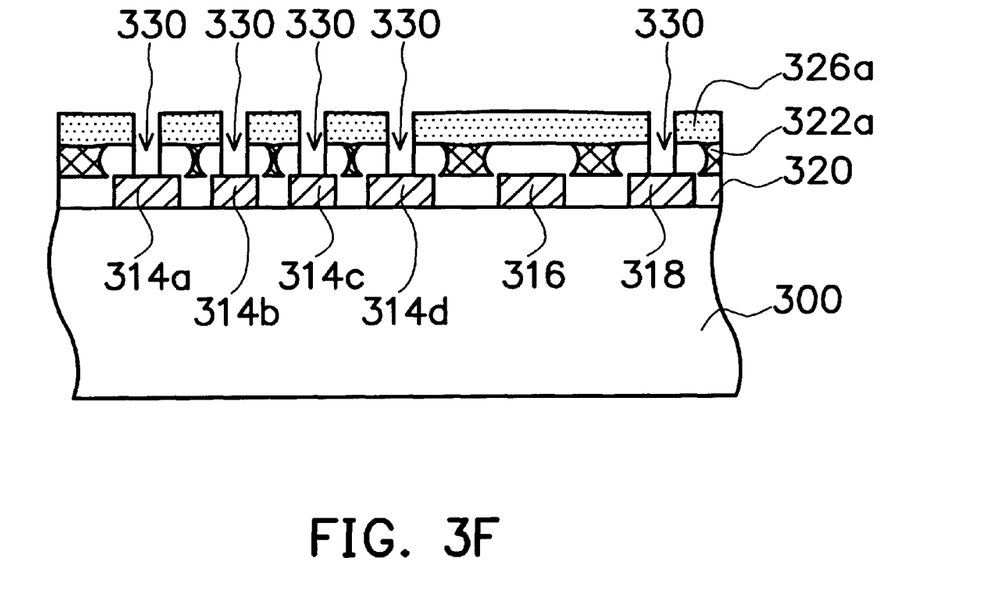
Figure 4C:
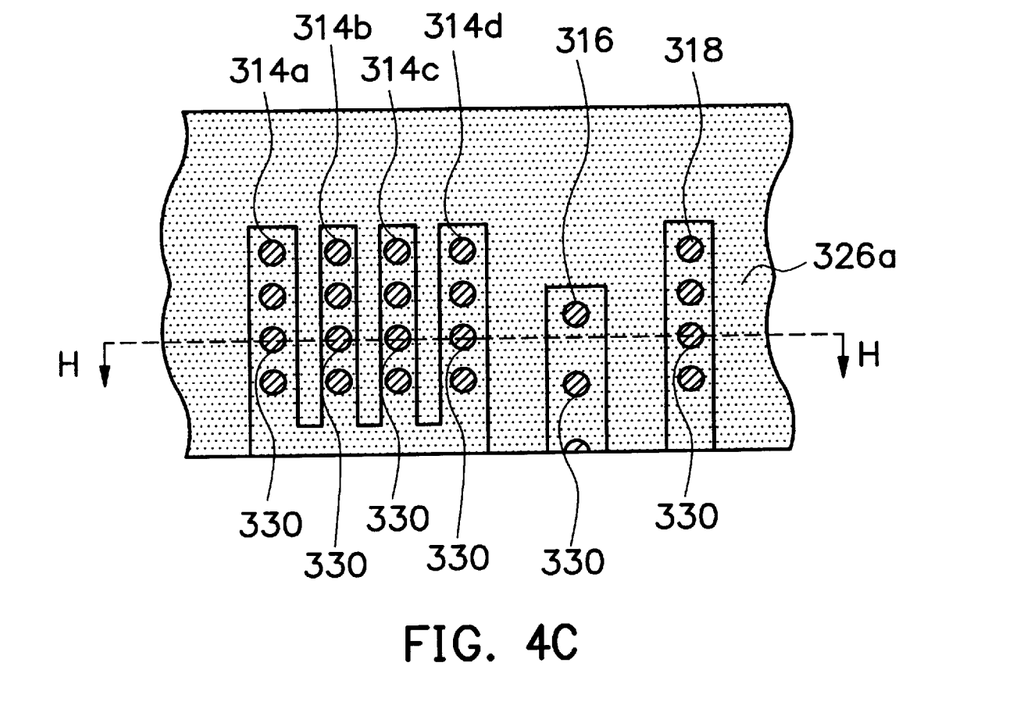
FIG. 4C is a top of the device shown in FIG. 3F.

In FIG. 3F, using photolithography and etching process, the sandwich type spin-on-glass layer is patterned to form openings which expose a part of the metal layers 314a, 314b, 314c, 314c, and 318. A top view of this figure is shown as FIG. 4C.

Figure 3G:
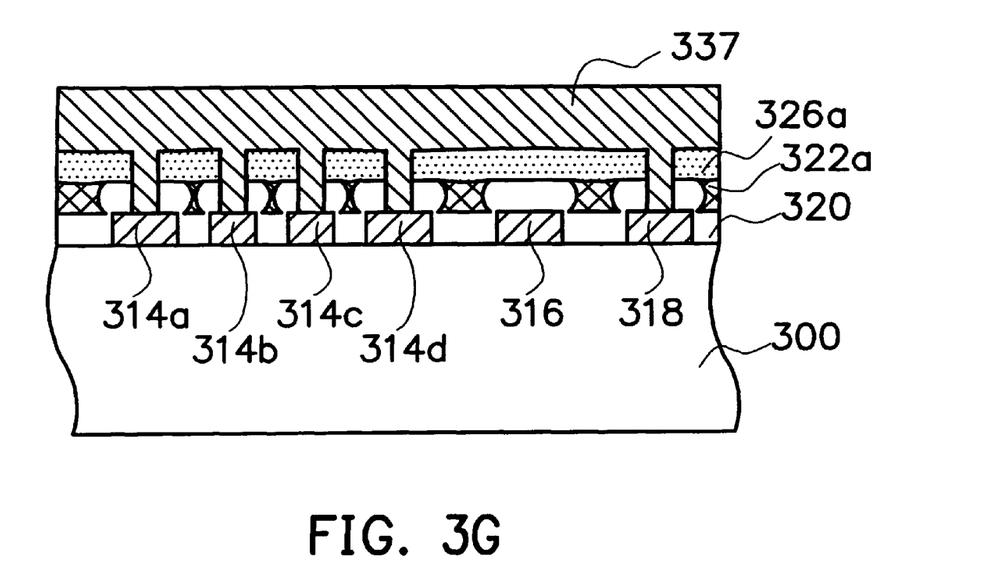
Figure 4D:
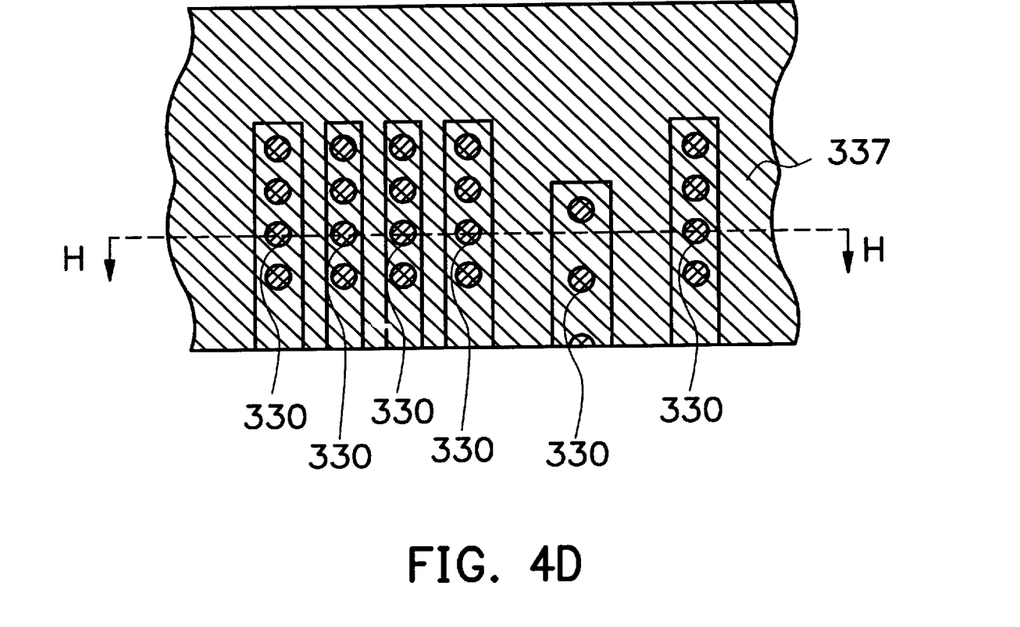
FIG. 4D is a top of the device shown in FIG. 3G.

In FIG. 3G, a conductive layer 337 is formed to cover the sandwich type spin-on-glass layer and to fill the openings 330. The conductive layer 337 is then etched or polished to form contact plugs within the openings 330. A top view of the contact plugs are shown as FIG. 4D. A second metal layer is then formed on the sandwich type spin-on-glass layer and the contact plug. The formation of the contact plugs and the second metal layers are formed by the conventional method. Thus, the detailed description is omitted here.

During the process of forming the contact plugs, the spin-on-glass layer 322a is only remained to fill the recesses within the dielectric layer 320. Therefore, while forming the openings 330, there is no worry that the spin-on-glass layer 322a is exposed to outgas. Thus, by the invention, the formation of a gas void, that is, the contact plug being poisoned, is prevented. Furthermore, without remaining the spin-on-glass layer 322a on the surface of the dielectric layer 320, the aspect ratio of forming the openings 330 is reduced. As a consequence, a better step coverage is obtained.

Another method for forming a contact plug without being poisoned is shown as FIG. 5A to FIG. 5D. The same as the previous example, in FIG. 5A, a substrate 300 comprising metal layers 314, 316, and 318 is provided. The metal layer 314 has a flat and large surface area which causes a spin-on-glass layer formed subsequently to remain thereon.

Figure 5A:
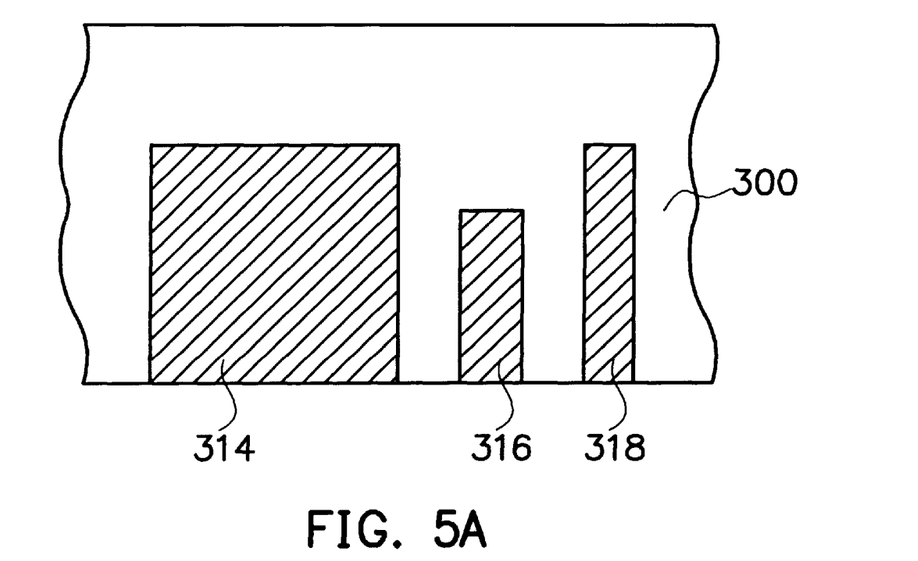
FIG. 5A to FIG. 5D are top views showing a method of forming a contact plug in another preferred embodiment according to the invention
Figure 5B:
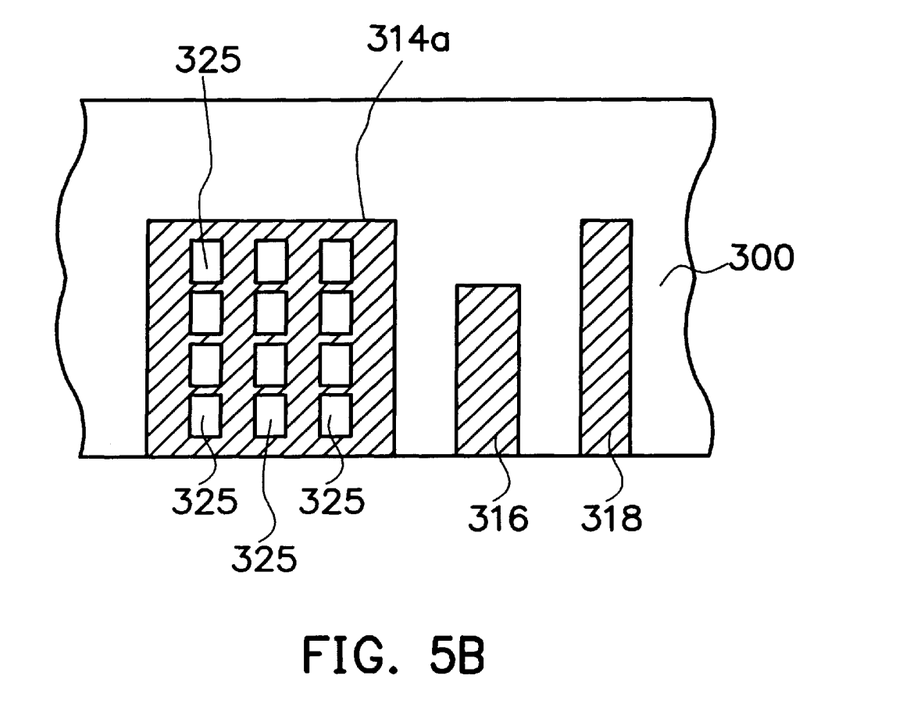

In FIG. 5B, a part of the metal layer 314 is removed to form a mesh-like metal layer 314a. Therefore, a part of the substrate 300 is exposed at the positions where the metal layer 314 is removed. Preferably, a photolithography and etching process is performed to form the mesh-like metal layer 314a. As a result, the flat and large surface area on the metal layer 314 is transformed into an uneven surface with recesses 325 as shown in the figure.

Figure 5C:
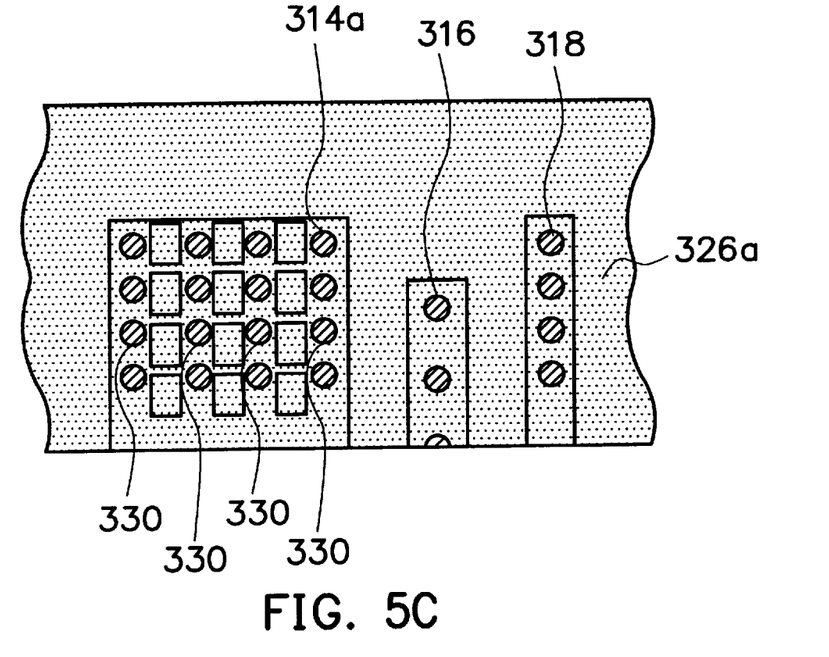

In FIG. 5C, a sandwich type spin-on-glass layer 326a is formed to cover the metal layers 314a, 316, 318 and the substrate 300. The sandwich type spin-on-glass layer 326a may comprise a dielectric layer, a spin-on-glass layer and another dielectric layer. The process of forming the sandwich type spin-on-glass layer 326a is the same as the first example. Using photolithography and etching process, contact holes 330 which expose the metal layers 314a, 316 and 318 are formed.

Figure 5D:
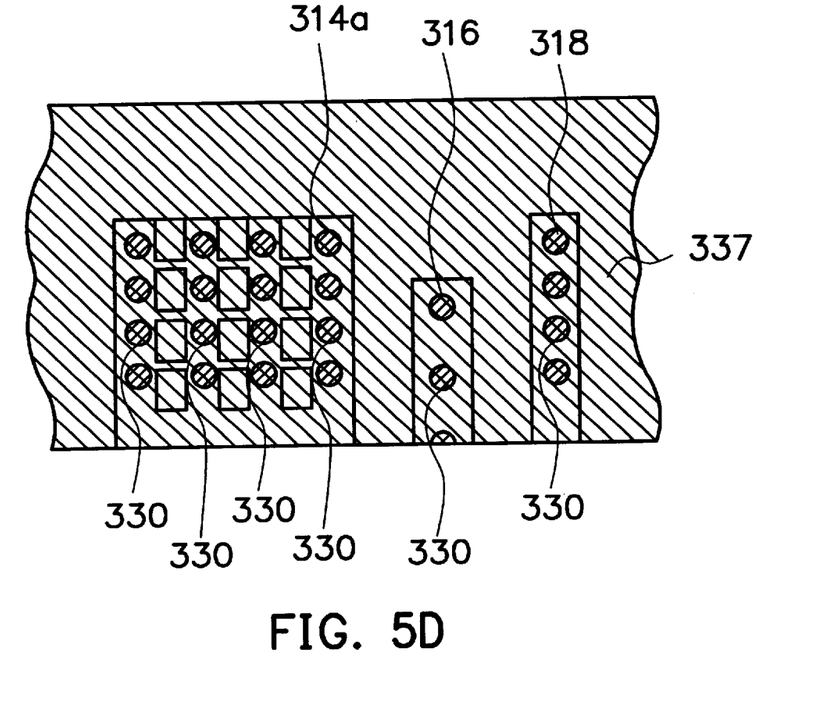

In FIG. 5D, a conductive layer 337 is formed to cover the sandwich type spin-on-glass layer and to fill the openings 330. The conductive layer 337 is then etched or polished to form contact plugs within the openings 330. A second metal layer is then formed on the sandwich type spin-on-glass layer and the contact plug. The formation of the contact plugs and the second metal layers are formed by the conventional method. Thus, the detailed description is omitted here.

During the process of forming the contact plugs, the spin-on-glass layer is only remained to fill the recesses 325 within the dielectric layer. Therefore, while forming the openings 330, there is no worry that the spin-on-glass layer is exposed to outgas. Thus, by the invention, the formation of a gas void, that is, the contact plug being poisoned, is prevented. Furthermore, without remaining the spin-on-glass layer on the surface of the dielectric layer, the aspect ratio of forming the openings 330 is reduced. As a consequence, a better step coverage is obtained.

Other embodiments of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. A method of forming a contact plug on a semiconductor substrate which comprises at least a metal layer having a flat surface region, comprising:

removing a part of the metal layer to result in a plurality of metal layers with smaller surface areas on the substrate;

forming a first dielectric layer on the metal layers;

forming a spin-on-glass layer on the first dielectric layer;

etching back the spin-on-glass layer until the first dielectric layer is exposed;

forming a second dielectric layer on the spin-on-glass layer;

forming at least an opening penetrating through the second dielectric layer, the spin-on-glass layer and the first dielectric layer; and filling the opening with a contact plug.

2. The method according to claim 1, wherein the first dielectric layer includes a silicon oxide layer formed by plasma-enhanced chemical vapor deposition with tetra-ethyl-ortho-silicate as precursor.

3. The method according to claim 1, wherein the second dielectric layer includes a silicon oxide layer formed by plasma-enhanced chemical vapor deposition with tetra-ethyl-ortho-silicate as precursor.

4. The method according to claim 1, further comprising the step of etching back the spin-on-glass layer by dry etch with a mixture of carbon fluoride as an etching gas.

5. The method according to claim 1, further comprising the step of etching back the spin-on-glass layer by dry etch with a mixture of carbon tri-fluoride as an etching gas.

6. The method according to claim 1, further comprising the step of forming a second metal layer to cover the second dielectric layer and to couple with the metal layer via the contact plug.

7. A method of forming a contact plug on a semiconductor substrate which comprises at least a metal layer having a flat surface region, comprising:

patterning the metal layer to a mesh-like metal layers with an uneven surface on the substrate;

forming a first dielectric layer on the metal layers;

forming a spin-on-glass layer on the first dielectric layer;

etching back the spin-on-glass layer until the first dielectric layer is exposed;

forming a second dielectric layer on the spin-on-glass layer;

forming at least an opening penetrating through the second dielectric layer, the spin-on-glass layer and the first dielectric layer; and filling the opening with a contact plug.

8. A method for preventing a contact plug on a semiconductor substrate having at least a metal with a large and flat surface area from being poisoned, comprising:

breaking the large and flat surface area of the metal layer into an uneven surface area with recesses;

forming a sandwich type spin-on-glass layer on the metal layer;

forming at least an opening penetrating through the sandwich type dielectric layer to expose a part of the metal layer; and filling the opening with a contact plug.

* * * * *